(12) United States Patent
Lai et al.

(10) Patent No.: US 9,041,687 B2
(45) Date of Patent: May 26, 2015

(54) COMMUNICATION METHOD FOR CAPACITIVE TOUCH PANEL

(71) Applicant: HTC Corporation, Taoyuan, Taoyuan County (TW)

(72) Inventors: Ming-Te Lai, Taoyuan (TW); Te-Mu Chen, Taoyuan (TW)

(73) Assignee: HTC Corporation, Taoyuan (TW)

( * ) Notice: Subject to any disclaimer, the term of this patent is extended or adjusted under 35 U.S.C. 154(b) by 209 days.

(21) Appl. No.: 13/648,016

(22) Filed: Oct. 9, 2012

(65) Prior Publication Data

US 2013/0147760 A1 Jun. 13, 2013

Related U.S. Application Data

(60) Provisional application No. 61/567,902, filed on Dec. 7, 2011.

(51) Int. Cl.
*G06F 3/041* (2006.01)
*G06F 3/044* (2006.01)
*H04B 5/00* (2006.01)

(52) U.S. Cl.
CPC .............. *G06F 3/044* (2013.01); *H04B 5/0012* (2013.01)

(58) Field of Classification Search
None
See application file for complete search history.

(56) References Cited

U.S. PATENT DOCUMENTS

| 2005/0184971 | A1 | 8/2005 | Ogino et al. |
| 2008/0158175 | A1 | 7/2008 | Hotelling et al. |
| 2009/0255737 | A1 | 10/2009 | Chang et al. |
| 2011/0163965 | A1 | 7/2011 | Hsu et al. |
| 2011/0248932 | A1 | 10/2011 | Wu et al. |
| 2011/0248934 | A1 | 10/2011 | Yeh et al. |

FOREIGN PATENT DOCUMENTS

| CN | 1667475 A | 9/2005 |
| TW | 200941324 A1 | 10/2009 |
| TW | 201124894 A1 | 7/2011 |
| WO | WO 2011155939 A1 * | 12/2011 |

* cited by examiner

*Primary Examiner* — Joseph Haley
(74) *Attorney, Agent, or Firm* — Birch, Stewart, Kolasch & Birch, LLP (57) ABSTRACT

A communication system is provided. A first device includes a first capacitive touch panel module. A second device includes a second capacitive touch panel module. A first overlapping area is formed when the second capacitive touch panel module of the second device is near to or contacts with the first capacitive touch panel module of the first device. The second device obtains data from the first device according to an electric field variation of the first overlapping area.

24 Claims, 12 Drawing Sheets

COMMUNICATION METHOD FOR CAPACITIVE TOUCH PANEL

CROSS REFERENCE TO RELATED APPLICATIONS

This Application claims priority of U.S. Provisional Application No. 61/567,902, filed on Dec. 7, 2011, the entirety of which is incorporated by reference herein.

BACKGROUND OF THE INVENTION

1. Field of the Invention

The invention relates to a communication method, and more particularly to a communication method of a capacitive touch panel.

2. Description of the Related Art

Nowadays, a touch panel is a common user interface for electronic products. Standard touch panel technologies include projected capacitive touch sensing.

A projected capacitive touch sensing solution generally requires two sets of electrodes: a first set of electrodes are coupled to a transmitter, which are transmitter electrodes; and a second set of electrodes are coupled to a receiver, which are receiver electrodes. In general, the transmitter powers the transmitter electrodes in turn. The powered transmitter electrode builds an electric field with the receiver electrodes of the panel. The changes in the electric field caused by user touch are used to recognize the touch of a user.

BRIEF SUMMARY OF THE INVENTION

Communication systems and methods for capacitive touch panel modules are provided. An embodiment of a communication system, comprises: a first device comprising a first capacitive touch panel module; and a second device comprising a second capacitive touch panel module, wherein a first overlapping area is formed when the second capacitive touch panel module of the second device is near to or contacts with the first capacitive touch panel module of the first device. The second device obtains data from the first device according to an electric field variation of the first overlapping area.

Moreover, an embodiment of a communication method for data transmission between a first device and a second device is provided. The first device comprises a first capacitive touch panel module and the second device comprises a second capacitive touch panel module, wherein a first overlapping area is formed when the second capacitive touch panel module of the second device is near to or contacts with the first capacitive touch panel module of the first device. An electric energy is applied to the second capacitive touch panel module of the second device by the first capacitive touch panel module of the first device via the first overlapping area. An electric field variation is obtained by the second capacitive touch panel module of the second device in response to the electric energy. Data from the first device is obtained according to the electric field variation by the second device.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
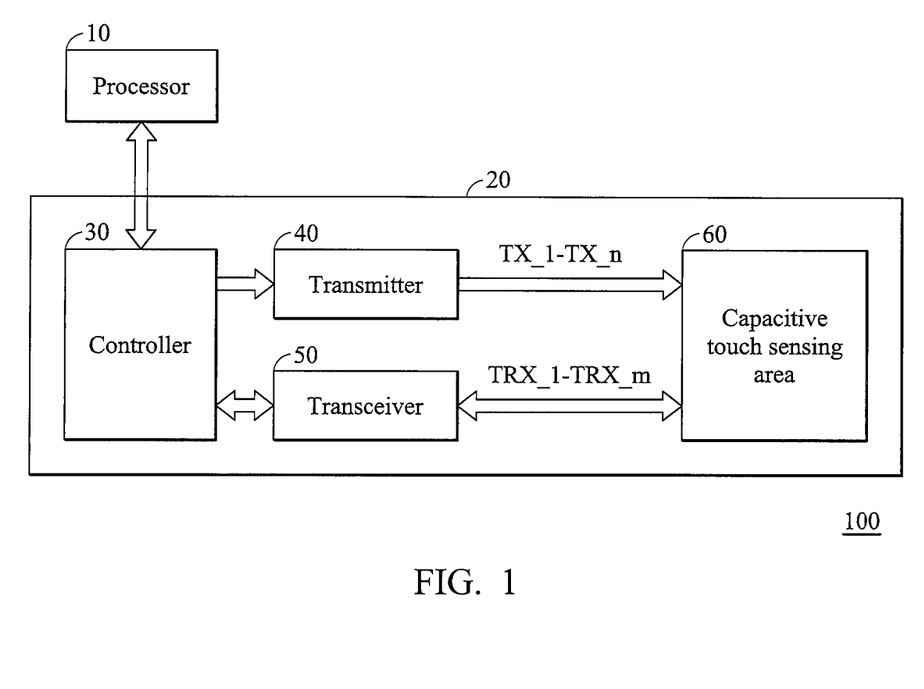
FIG. 1 shows a schematic diagram illustrating an electronic device according to an embodiment of the invention.

FIG. 1 shows a schematic diagram illustrating an electronic device 100 according to an embodiment of the invention. The electronic device 100 comprises a processor 10 and a capacitive touch panel module 20, wherein the capacitive touch panel module 20 comprises a controller 30, a transmitter 40, a transceiver 50 and a capacitive touch sensing area 60. The capacitive touch sensing area 60 comprises a plurality of first electrodes coupled to the transmitter 40 and a plurality of second electrodes coupled to the transceiver 50. When the processor 10 controls the capacitive touch panel module 20 to enter a sensing mode, the controller 30 controls the transmitter 40 to apply the voltages TX_1 to TX_n to the first electrodes, and then the transceiver 50 receives the voltages TRX_1 to TRX_m corresponding to electric field intensity from the second electrodes and decodes the received voltages TRX_1 to TRX_m, so as to provide data to the controller 30 for recognition of a touch by a finger of a user. Except for the sensing mode, the electronic device 100 further controls the capacitive touch panel module 20 to enter a communication mode for transmitting data to or receiving data from another electronic device via the capacitive touch panel module 20. Details of the execution of the communication method of the capacitive touch panel module 20 are described below.

Figure 2:
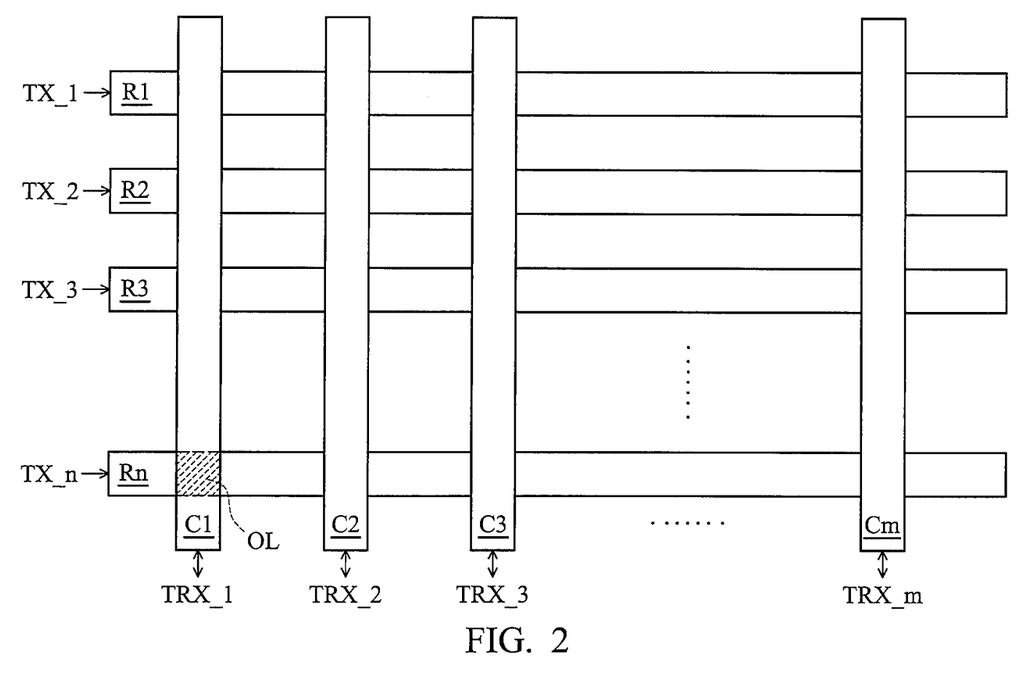
FIG. 2 shows an example illustrating a top view layout diagram of the capacitive touch sensing area of FIG. 1.

FIG. 2 shows an example illustrating a top view layout diagram of the capacitive touch sensing area 60 of FIG. 1. In FIG. 2, a plurality of first electrodes R1 to Rn and a plurality of second electrodes C1 to Cm form a layout pattern, wherein the first electrodes R1 to Rn are disposed in a first layer and the second electrodes C1 to Cm are disposed in a second layer, and the second layer is disposed between a cover glass and the first layer. The first electrodes R1 to Rn and the second electrodes C1 to Cm are all transparent conductive materials, such as Indium Tin Oxide (ITO). The first electrodes R1 to Rn are spaced apart from the second electrodes C1 to Cm vertically by dielectric materials. Referring to FIG. 1 and FIG. 2 together, the first electrodes R1 to Rn are coupled to the transmitter 40, and the controller 30 controls the transmitter 40 to provide the voltages TX_1 to TX_n to the first electrodes R1 to Rn, respectively. The second electrodes C1 to Cm are coupled to the transceiver 50, and the controller 30 controls the transceiver 50 to provide the voltages TRX_1 to TRX_m to the second electrodes C1 to Cm, or to receive the voltages TRX_1 to TRX_m from the second electrodes C1 to Cm, respectively. Taking the first electrode Rn and the second electrode C1 of FIG. 2 as an example, an electric field is formed at an overlapping area OL between the first electrode Rn and the second electrode C1 when the transmitter 40 provides the voltage TX_n to the first electrode Rn and the transceiver 50 receives the voltage TRX_1 from the second electrode C1. In other words, the transceiver 50 can sense the voltage TRX_1 to obtain an electric field variation of the overlapping area OL in a sensing mode, wherein the electric field variation is produced on the layout pattern according to a spatially arranged manner or a chronological manner.

Figure 3:
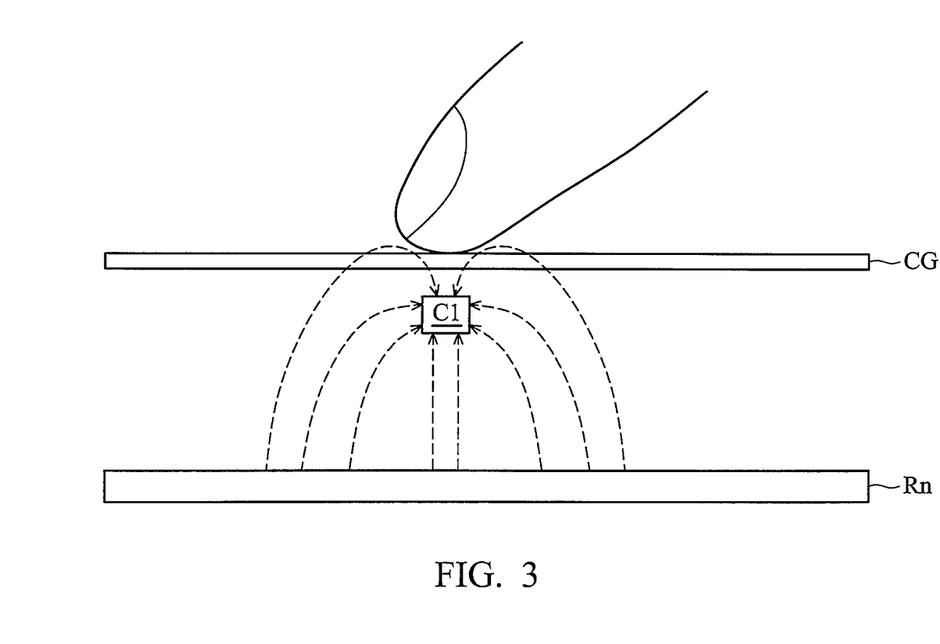
FIG. 3 shows a sectional view illustrating the electric field formed at the overlapping area of FIG. 2.

FIG. 3 shows a sectional view illustrating the electric field formed at the overlapping area OL of FIG. 2. For conventional capacitive touch sensing technologies, the electric field is changed when a finger or the like touches a surface of a cover glass CG. Therefore, the voltage TRX_1 received by the transceiver 50 is also changed in response to the electric field variation at the overlapping area OL.

Figure 4:
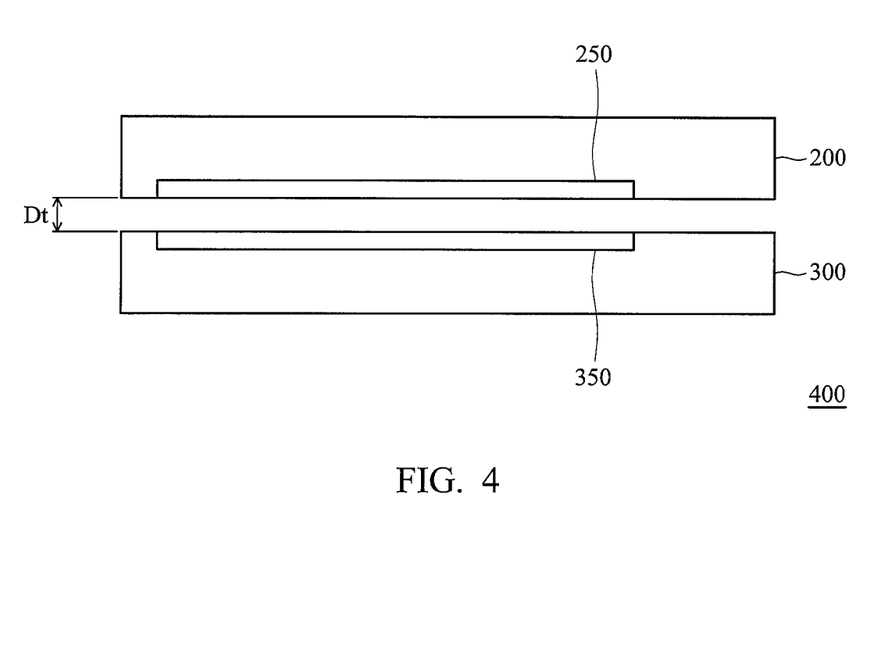
FIG. 4 shows a schematic diagram illustrating a communication system according to an embodiment of the invention.

FIG. 4 shows a schematic diagram illustrating a communication system 400 according to an embodiment of the invention. The communication system 400 comprises two electronic devices 200 and 300. In FIG. 4, a near field communication is performed between two electronic devices 200 and 300 for data transmission. In the embodiment, the electronic device 200 may be a mobile phone having a capacitive touch panel module 250 and the electronic device 300 may be a mobile phone having a capacitive touch panel module 350, wherein each of the capacitive touch panel modules 250 and 350 comprises a transmitter, a controller, a transceiver and a capacitive touch sensing area, as shown in FIG. 1. In FIG. 4, the electronic device 200 is arranged in a face-to-face relation to the electronic device 300, e.g. a cover glass of the capacitive touch panel module 250 of the electronic device 200 is close to or touches a cover glass of the capacitive touch panel module 350 of the electronic device 300. For example, a distance Dt between the cover glasses of the capacitive touch panel modules 250 and 350 is close to zero. Therefore, data can be transferred between the capacitive touch panel modules 250 and 350 for the electronic devices 200 and 300.

Figure 5A:
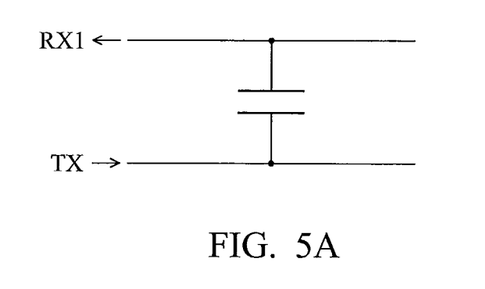
FIGS. 5A, 5B and 5C show the schematics illustrating various electric field variations in a capacitive touch panel module.
Figure 5B:
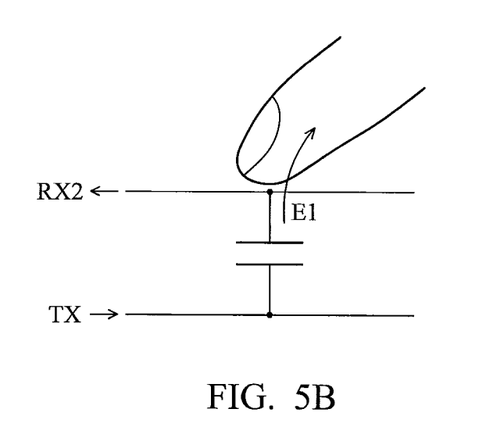
Figure 5C:
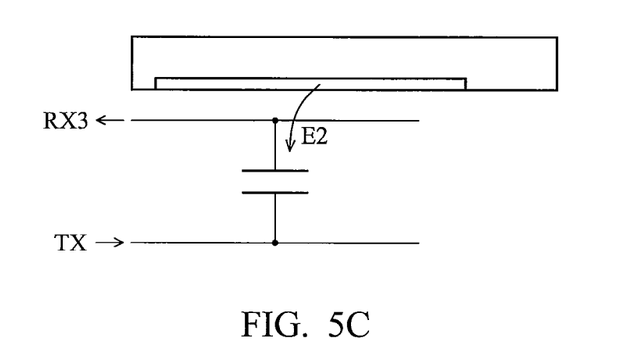
Figure 6:
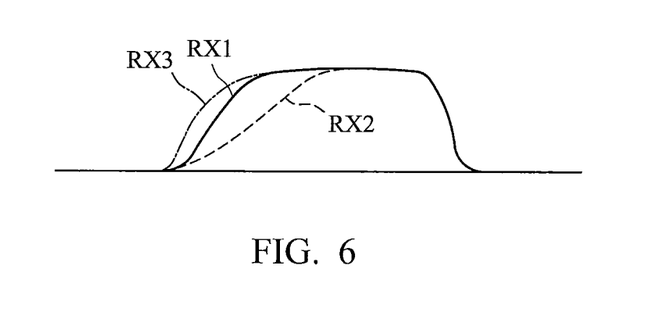
FIG. 6 shows the sensed voltages of the capacitive touch panel module in response to the electric field variations of FIGS. 5A, 5B and 5C, respectively.

FIGS. 5A, 5B and 5C show the schematics illustrating various electric field variations in a first capacitive touch panel module (e.g. 250 of FIG. 4), and FIG. 6 shows the sensed voltages RX1, RX2 and RX3 of the first capacitive touch panel module in response to the electric field variations of FIGS. 5A, 5B and 5C, respectively. FIG. 5A shows that no finger or a second capacitive touch panel module (e.g. 350 of FIG. 4) is close to or touches the first capacitive touch panel module. FIG. 5B shows that a finger has touched the first capacitive touch panel module, thus an electric energy E1 is absorbed by the finger. FIG. 5C shows that a second capacitive touch panel module of another electronic device is near to or contacts with the first capacitive touch panel module, thus an electric energy E2 from the second capacitive touch panel module is applied to the first capacitive touch panel module. Therefore, the sensed voltage RX3 has a slope steeper than that of the sensed voltages RX1 and RX2 in FIG. 6 because the additional electric energy E2 from the second capacitive touch panel module is applied to the first capacitive touch panel module. Furthermore, the sensed voltage RX2 has a slope that is less than that of the sensed voltages RX1 and RX3 because of the electric energy E1 is absorbed. Specifically, the sensed voltages can be used to determine whether a finger or another capacitive touch panel module is close to or touches a capacitive touch panel module.

Figure 7:
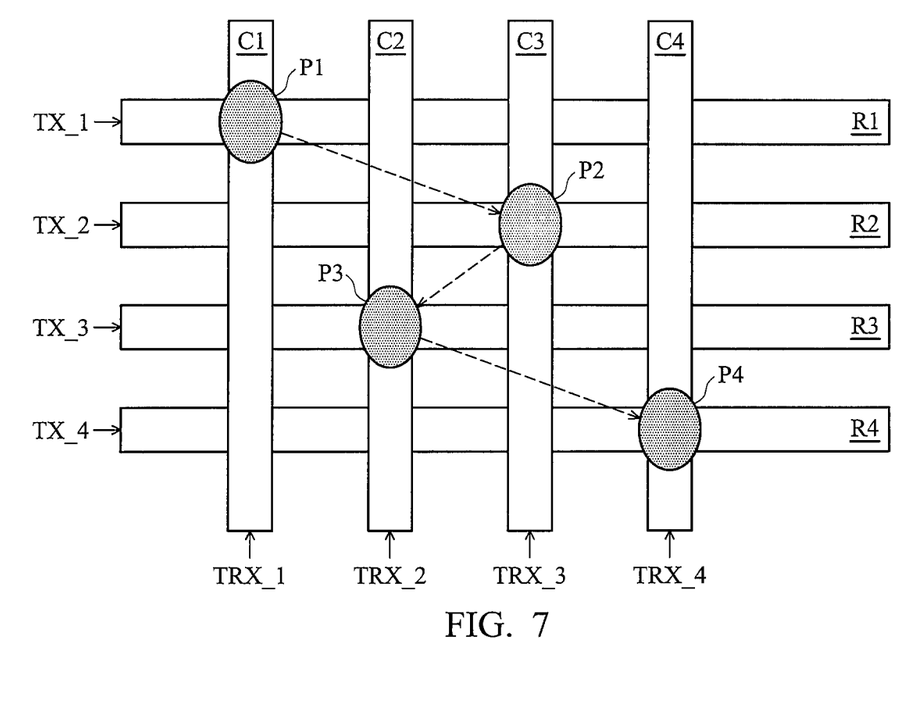
FIG. 7 shows an example illustrating data communication for a capacitive touch panel module according to an embodiment of the invention.

FIG. 7 shows an example illustrating data communication for a capacitive touch panel module according to an embodiment of the invention. In FIG. 7, only the first electrodes R1 to R4 and the second electrodes C1 to C4 are used to form a layout pattern in order to simplify description. Referring to FIG. 1 and FIG. 7 together, the transmitter 40 respectively provides the voltages TX_1 to TX_4 to the first electrodes R1 to R4, and the transceiver 50 respectively provides the voltages TRX_1 to TRX_4 to the second electrodes C1 to C4. In the embodiment, the transceiver 50 functions as another transmitter to apply the voltages TRX_1 to TRX_4 to the second electrodes C1 to C4. Referring to FIG. 4 and FIG. 7 together, the electronic device 200 uses the capacitive touch panel module 250 thereof to transmit a predefined pattern to the capacitive touch panel module 350 of the electronic device 300 according to a specific rule, and then the electronic device 300 decodes the received pattern to obtain the corresponding data. For example, in the electronic device 200, first, in the first step, the processor (e.g. 10 of FIG.) controls the transmitter (e.g. 40 of FIG. 1) to apply the voltage TX_1 to the first electrode R1 and controls the transceiver (e.g. 50 of FIG. 1) to apply the voltage TRX_1 to the second electrode C1 simultaneously. Thus a specific electric field is formed at an overlapping area P1 between the first electrode R1 and the second electrode C1. Next, in a second step, the voltage TX_2 is applied to the first electrode R2 and the voltage TRX_3 is applied to the second electrode C3, thus a specific electric field is formed at an overlapping area P2 between the first electrode R2 and the second electrode C3. Next, in a third step, the voltage TX_3 is applied to the first electrode R3 and the voltage TRX_2 is applied to the second electrode C2, thus a specific electric field is formed at an overlapping area P3 between the first electrode R3 and the second electrode C2. Next, in a fourth step, the voltage TX_4 is applied to the first electrode R4 and the voltage TRX_4 is applied to the second electrode C4, thus a specific electric field is formed at an overlapping area P4 between the first electrode R4 and the second electrode C4. In the electronic device 300, the capacitive touch panel module 350 obtains the pattern transmitted by the capacitive touch panel module 250 of the electronic device 200 by sensing the specific electric fields at the overlapping areas P1, P2, P3 and P4 in sequence. Next, the processor (e.g. 10 of FIG. 1) or the controller (e.g. 30 of FIG. 1) of the electronic device 300 may identify the obtained pattern, so as to obtain data information corresponding to the obtained pattern. Thus, a near field communication is performed between the electronic devices 200 and 300 via the capacitive touch panel modules 250 and 350. In the embodiment, the electric field variation is produced on the layout pattern formed by the first electrodes R1-R4 and the second electrodes C1-C4 in a spatially arranged manner.

Figure 8:
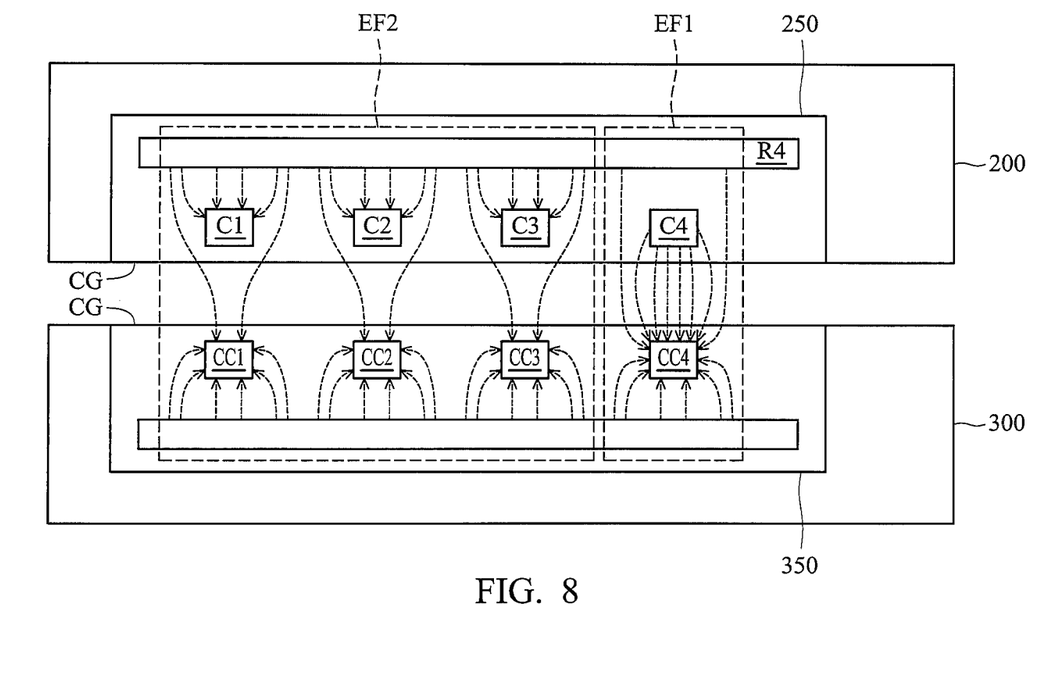
FIG. 8 shows a schematic diagram illustrating the specific electric field at the overlapping area in the fourth step of FIG. 7.

FIG. 8 shows a schematic diagram illustrating the specific electric field at the overlapping area P4 in the fourth step of FIG. 7. Referring to FIG. 7 and FIG. 8 together, an electric field E1 between the capacitive touch panel modules 250 and 350 represents that the voltage TX_4 is applied to the first electrode R4 and the voltage TRX_4 is applied to the second electrode C4. An electric field E2 between the capacitive touch panel modules 250 and 350 represents that the voltage TX_4 is applied to the first electrode R4 and no voltages are applied to the second electrodes C1 to C3. Thus, a second electrode CC4 of the capacitive touch panel module 350 senses a larger electric energy than the other second electrodes CC1 to CC3 of the capacitive touch panel module 350.

Figure 9:
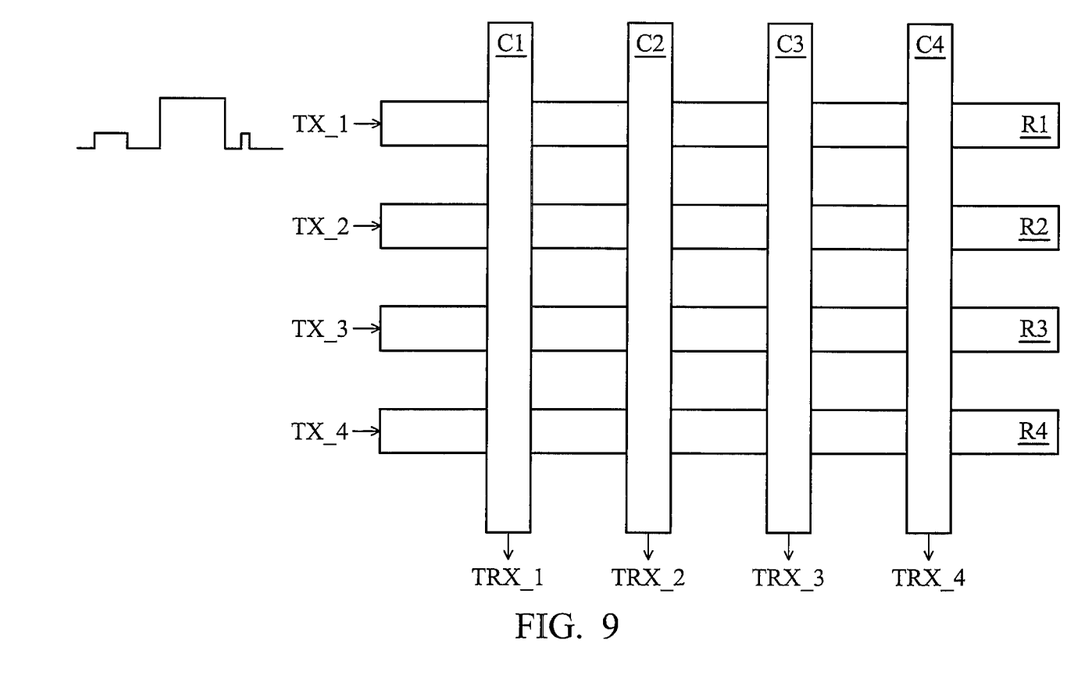
FIG. 9 shows an example illustrating data communication for a capacitive touch panel module according to another embodiment of the invention.

FIG. 9 shows an example illustrating data communication for a capacitive touch panel module according to another embodiment of the invention. In FIG. 9, only the first electrodes R1 to R4 and the second electrodes C1 to C4 are used to form a layout pattern in order to simplify description. Referring to FIG. 1 and FIG. 9 together, the transmitter 40 respectively provides the voltages TX_1 to TX_4 to the first electrodes R1 to R4, wherein each of the voltages TX_1, TX_2, TX_3 or TX_4 may have variable duties and amplitudes. The transceiver 50 respectively receives the voltages TRX_1 to TRX_4 from the second electrodes C1 to C4. In the embodiment, the transceiver 50 functions as a receiver for sensing the voltages TRX_1 to TRX_4. Referring to FIG. 4 and FIG. 9 together, the electronic device 200 controls the transmitter (e.g. 40 of FIG. 1) of the capacitive touch panel module 250 to generate a voltage TX_1 having variable duties and amplitudes to the first electrode R1, thus a specific electric field is formed at the first electrode R1, wherein the variable duties and amplitudes will affect the electric field variation. Thus, the transceiver (e.g. 50 of FIG. 1) of the capacitive touch panel module 350 may obtain the voltages having variable duties and amplitudes according to the electric field variations. Similarly, the processor or controller of the electronic device 300 may identify the obtained voltages, so as to obtain data information corresponding to the obtained voltages. Thus, a near field communication is performed between the electronic devices 200 and 300 via the capacitive touch panel modules 250 and 350. In the embodiment, data bandwidth is increased when the quality of the voltages having variable duties and amplitudes that are used to transmit data at the same time, is increased. In the embodiment, the electric field variation is produced on the layout pattern formed by the first electrodes R1-R4 and the second electrodes C1-C4 in a chronological manner.

Figure 10:
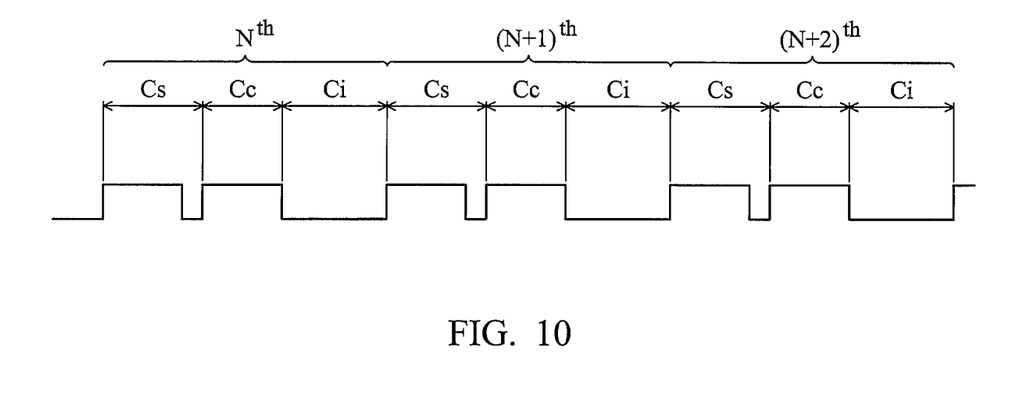
FIG. 10 shows a timing diagram illustrating the operating periods of the electronic device of FIG. 1 according to an embodiment of the invention.
Figure 11:
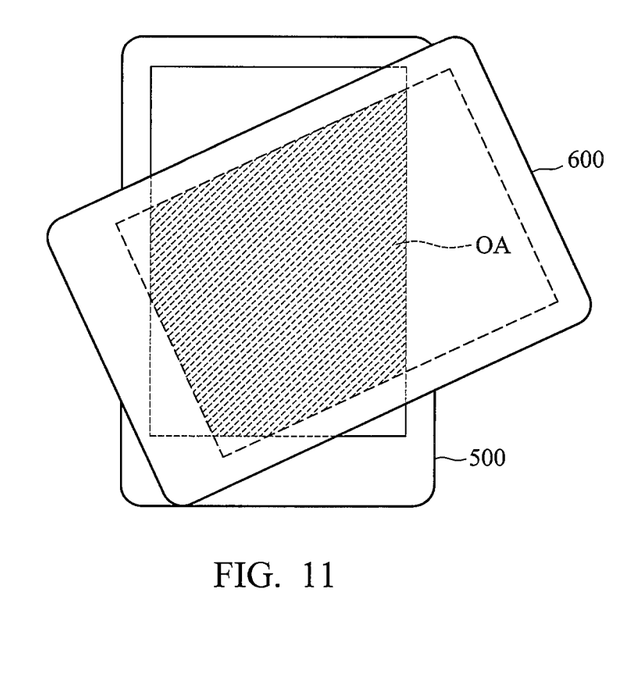
FIG. 11 shows an example illustrating a synchronization procedure between two electronic devices.

FIG. 10 shows a timing diagram illustrating the operating periods of the electronic device 100 of FIG. 1 according to an embodiment of the invention. In FIG. 10, each operating period comprises a scan cycle Cs, a communication cycle Cc and an idle cycle Ci. Referring to FIG. 1 and FIG. 10 together, the processor 10 controls the capacitive touch panel module 20 to enter a sensing mode for sensing a finger touch at every scan cycle Cs. If a near field communication between the electronic device 100 and a neighboring electronic device is being performed, the processor 10 of the electronic device 100 may control the touch panel module 20 to enter a communication mode at every communication cycle Cc for data transmission. In addition, the neighboring electronic device may determine whether a finger or another capacitive touch panel module is close to or touches its capacitive touch panel module according to its sensed voltages or other sensing devices, such as a light sensor. During the communication cycles Cc, a synchronization procedure is performed by the electronic device 100 and the neighboring electronic device for initialization and orientation, so as to synchronize the communication cycles Cc of the electronic device 100 and the neighboring electronic device and to orientate and obtain an overlapping area between the capacitive touch panel modules of the two electronic devices for transferring data. For example, referring to FIG. 11, it shows an example illustrating a synchronization procedure between the electronic devices 500 and 600, so as to obtain the overlapping area OA. In FIG. 11, the electronic device 500 is arranged in a face-to-face relation to the electronic device 600, and the electronic devices 500 and 600 can use the communication methods of the embodiments to transmit data or return responses (e.g. acknowledgement) via the overlapping area OA of the capacitive touch sensing areas of the electronic devices 500 and 600.

Figure 12:
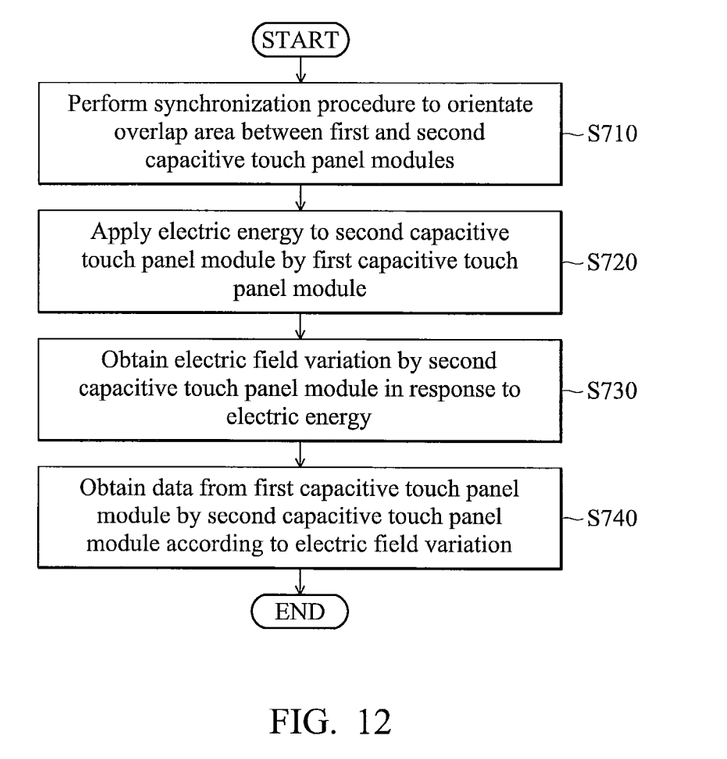
FIG. 12 shows a communication method for data transmission between two devices, each having a capacitive touch panel module according to an embodiment of the invention.

FIG. 12 shows a communication method for data transmission between two devices, each having a capacitive touch panel module (e.g. 20 of FIG. 1) according to an embodiment of the invention. In the embodiment, a first capacitive touch panel module of a first device is near to or contacts with a second capacitive touch panel module of a second device to form an overlapping area. First, in step S710, a synchronization procedure is performed to orientate the overlapping area between the first and second capacitive touch panel modules. Next, in step S720, the first capacitive touch panel module of the first device applies an electric energy to the second capacitive touch panel module of the second device via the overlapping area, as shown in FIG. 7 and FIG. 9. Next, in step S730, the second capacitive touch panel module of the second device obtains an electric field variation in response to the electric energy. Next, in step S740, the second capacitive touch panel module of the second device obtains data from the first device according to the electric field variation.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication system, comprising:
    a first device comprising a first capacitive touch panel module; and
    a second device comprising a second capacitive touch panel module, wherein a first overlapping area is formed when the second capacitive touch panel module of the second device is near to or contacts with the first capacitive touch panel module of the first device,
    wherein the second device obtains data from the first device according to an electric field variation of the first overlapping area, and
    wherein a synchronization procedure is performed between the first and second devices, so as to synchronize a plurality of communication cycles of the first device and the second device and to orientate and obtain the first overlapping area between the first capacitive touch panel module and the second capacitive touch panel module.

2. The communication system as claimed in claim 1, wherein the first capacitive touch panel module comprises:
    a capacitive touch sensing area, comprising:
       a plurality of electrodes spaced apart from each other by dielectric materials, wherein the electrodes form a layout pattern; and
    a transmitter coupled to the capacitive touch sensing area, transmitting a plurality of signals to the electrodes of the capacitive touch sensing area, so as to produce the electric field variation on the layout pattern according to a specific manner.

3. The communication system as claimed in claim 2, wherein the electric field variation is produced on the layout pattern in a spatially arranged manner.

4. The communication system as claimed in claim 2, wherein the electric field variation is produced on the layout pattern in a chronological manner.

5. The communication system as claimed in claim 2, wherein when the transmitter of the first capacitive touch panel module transmits one of the signals to the corresponding electrode of the capacitive touch sensing area of the first capacitive touch panel module, the electric field variation of the first overlapping area is formed at the corresponding electrode of the capacitive touch sensing area of the first capacitive touch panel module of the first device.

6. The communication system as claimed in claim 2, wherein at least one of the signals has variable duties and amplitudes.

7. The communication system as claimed in claim 2, wherein when the electric field variation of the first overlapping area is formed, the second capacitive touch panel module receives a plurality of signals corresponding to the electric field variation, and the second device identifies the received signals, so as to obtain the data from the first device.

8. The communication system as claimed in claim 1, wherein the first capacitive touch panel module comprises:
a capacitive touch sensing area, comprising:
a plurality of first electrodes disposed in a first layer; and
a plurality of second electrodes disposed in a second layer, wherein the second electrodes are spaced apart from the first electrodes vertically by dielectric materials, and the first and second electrodes form a layout pattern;
a transmitter coupled to the capacitive touch sensing area, transmitting a plurality of first signals to the first electrodes of the capacitive touch sensing area, respectively; and
a transceiver coupled to the capacitive touch sensing area, transmitting a plurality of second signals to the second electrodes of the capacitive touch sensing area, respectively, and receiving a plurality of third signals from the second electrodes of the capacitive touch sensing area, respectively.

9. The communication system as claimed in claim 8, wherein when the transmitter of the first capacitive touch panel module transmits one of the first signals to the corresponding first electrode of the capacitive touch sensing area of the first capacitive touch panel module and the transceiver of the first capacitive touch panel module transmits one of the second signals to the corresponding second electrode of the capacitive touch sensing area of the first capacitive touch panel module simultaneously, the electric field variation of the first overlapping area is formed at a second overlapping area between the corresponding first and second electrodes of the capacitive touch sensing area of the first capacitive touch panel module of the first device.

10. The communication system as claimed in claim 8, wherein the electric field variation of the first overlapping area is formed at a second overlapping area between the corresponding first and second electrodes of the capacitive touch sensing area of the first capacitive touch panel module of the first device.

11. The communication system as claimed in claim 9, wherein when the transmitter of the first capacitive touch panel module transmits one of the first signals to the corresponding first electrode of the capacitive touch sensing area of the first capacitive touch panel module, the electric field variation of the first overlapping area is formed at the corresponding first electrode of the capacitive touch sensing area of the first capacitive touch panel module of the first device.

12. The communication system as claimed in claim 11, wherein when the transceiver of the first capacitive touch panel module transmits the one of the first signals to the corresponding first electrode of the capacitive touch sensing area of the first capacitive touch panel module, the transceiver of the first device receives the third signals from the second electrodes of the capacitive touch sensing area of the first capacitive touch panel module of the first device.

13. The communication system as claimed in claim 8, wherein at least one of the first signals has variable duties and amplitudes.

14. The communication system as claimed in claim 8, wherein when the electric field variation of the first overlapping area is formed, the second capacitive touch panel module receives a signal corresponding to the electric field variation, and the second device identifies the received signal, so as to obtain the data from the first device.

15. The communication system as claimed in claim 8, wherein the transmitter of the first capacitive touch panel module transmits the first signals to the corresponding first electrodes of the capacitive touch sensing area of the first capacitive touch panel module and the transceiver of the first capacitive touch panel module transmits the second signals to the corresponding second electrodes of the capacitive touch sensing area of the first capacitive touch panel module according to a specific rule, so as to form a predefined pattern on the layout pattern, wherein the electric field variation of the first overlapping area is formed in response to the predefined pattern on the layout pattern.

16. The communication system as claimed in claim 15, wherein when the electric field variation of the first overlapping area is formed, the second capacitive touch panel module receives a plurality of signals corresponding to the electric field variation, and the second device obtains the predefined pattern according to the received signals and decodes the predefined pattern to obtain the data from the first device.

17. The communication system as claimed in claim 1, wherein the electric field variation of the first overlapping area is formed when an electric energy from the first capacitive touch panel module of the first device is applied to the second capacitive touch panel module of the second device.

18. A communication method for data transmission between a first device and a second device, wherein the first device comprises a first capacitive touch panel module and the second device comprises a second capacitive touch panel module, and a first overlapping area is formed when the second capacitive touch panel module of the second device is near to or contacts with the first capacitive touch panel module of the first device, comprising:
performing a synchronization procedure between the first device and the second device to synchronize a plurality of communication cycles of the first device and the second device and to orientate and obtain the first overlapping area between the first capacitive touch panel module and the second capacitive touch panel module;
applying an electric energy to the second capacitive touch panel module of the second device by the first capacitive touch panel module of the first device via the first overlapping area; obtaining an electric field variation by the second capacitive touch panel module of the second device in response to the electric energy; and
obtaining data from the first device according to the electric field variation by the second device.

19. The communication method as claimed in claim 18, wherein the first capacitive touch panel module comprises:
a capacitive touch sensing area, comprising: a plurality of first electrodes disposed in a first layer; and a plurality of second electrodes disposed in a second layer, wherein the second electrodes are spaced apart from the first electrodes vertically by dielectric materials, and the first and second electrodes form a layout pattern.

20. The communication method as claimed in claim 19, wherein the step of applying the electric energy further comprises:

providing a first signal to one of the first electrodes of the capacitive touch sensing area of the first capacitive touch panel module by the first device; and providing a second signal to one of the second electrodes of the capacitive touch sensing area of the first capacitive touch panel module by the first device, wherein the electric energy is formed at a second overlapping area between the one of the first electrodes and the one of the second electrodes of the capacitive touch sensing area of the first capacitive touch panel module of the first device.

21. The communication method as claimed in claim 19, wherein the step of applying the electric energy further comprises:

providing a first signal to one of the first electrodes of the capacitive touch sensing area of the first capacitive touch panel module by the first device, wherein the electric energy is formed at the one of the first electrodes of the capacitive touch sensing area of the first capacitive touch panel module of the first device, and the first signal has variable duties and amplitudes.

22. The communication method as claimed in claim 18, wherein the step of obtaining the electric field variation further comprises:

receiving a signal corresponding to the electric field variation by the second capacitive touch panel module; and identifying the received signal to obtain the data from the first device by second device.

23. The communication method as claimed in claim 18, wherein the first capacitive touch panel module comprises:

a capacitive touch sensing area, comprising: a plurality of first electrodes disposed in a first layer.

24. The communication method as claimed in claim 23, wherein the step of applying the electric energy further comprises:

providing a first signal to one of the first electrodes of the capacitive touch sensing area of the first capacitive touch panel module by the first device, wherein the electric energy is formed at the one of the first electrodes of the capacitive touch sensing area of the first capacitive touch panel module of the first device, and the first signal has variable duties and amplitudes.

\* \* \* \* \*